US011862477B2

(12) United States Patent
Ichikawa et al.

(10) Patent No.: US 11,862,477 B2
(45) Date of Patent: Jan. 2, 2024

(54) METHOD FOR MANUFACTURING SEMICONDUCTOR DEVICE HAVING GALLIUM OXIDE-BASED SEMICONDUCTOR LAYER

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Shuhei Ichikawa, Nisshin (JP); Hiroki Miyake, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 110 days.

(21) Appl. No.: 17/551,274

(22) Filed: Dec. 15, 2021

(65) Prior Publication Data

US 2022/0230890 A1 Jul. 21, 2022

(30) Foreign Application Priority Data

Jan. 15, 2021 (JP) ................................ 2021-004786

(51) Int. Cl.
*H01L 21/00* (2006.01)
*H01L 21/425* (2006.01)
*H01L 29/24* (2006.01)

(52) U.S. Cl.
CPC ............ *H01L 21/425* (2013.01); *H01L 29/24* (2013.01)

(58) Field of Classification Search
CPC .............................. H01L 21/426; H01L 29/24
See application file for complete search history.

(56) References Cited

U.S. PATENT DOCUMENTS

2015/0236098 A1* 8/2015 Shimizu .................. H01L 29/45 257/77
2016/0002823 A1 1/2016 Sasaki et al.

FOREIGN PATENT DOCUMENTS

CN 110752159 A * 2/2020 ........... H01L 21/477

* cited by examiner

*Primary Examiner* — Reema Patel
(74) *Attorney, Agent, or Firm* — POSZ LAW GROUP, PLC

(57) ABSTRACT

A method for manufacturing a semiconductor device having a gallium oxide-based semiconductor layer includes: ion-implanting dopant into a gallium oxide-based semiconductor layer while heating the gallium oxide-based semiconductor layer; and annealing the gallium oxide-based semiconductor layer under an oxygen atmosphere, after the ion-implanting.

6 Claims, 2 Drawing Sheets

METHOD FOR MANUFACTURING SEMICONDUCTOR DEVICE HAVING GALLIUM OXIDE-BASED SEMICONDUCTOR LAYER

CROSS REFERENCE TO RELATED APPLICATION

The present application claims the benefit of priority from Japanese Patent Application No. 2021-004786 filed on Jan. 15, 2021. The entire disclosures of the above application are incorporated herein by reference.

TECHNICAL FIELD

The technique disclosed herein relates to a method for manufacturing a semiconductor device having a gallium oxide-based semiconductor layer.

BACKGROUND

A semiconductor device manufactured by using a gallium oxide-based semiconductor layer is expected to have low-loss electrical characteristics. In order to manufacture such a semiconductor device, a technique for forming an n-type or p-type diffusion region in a gallium oxide-based semiconductor layer is required.

SUMMARY

The present disclosure describes a method for manufacturing a semiconductor device having a gallium oxide-based semiconductor layer, which is capable of forming a diffusion region with less crystal damage. The method includes: ion-implanting a dopant into the gallium oxide-based semiconductor layer while heating the gallium oxide-based semiconductor layer; and annealing the gallium oxide-based semiconductor layer under an oxygen atmosphere after the ion-implanting.

BRIEF DESCRIPTION OF THE DRAWINGS

Objects, features and advantages of the present disclosure will become more apparent from the following detailed description made with reference to the accompanying drawings, in which like parts are designated by like reference numbers and in which.

DETAILED DESCRIPTION

Figure 1:
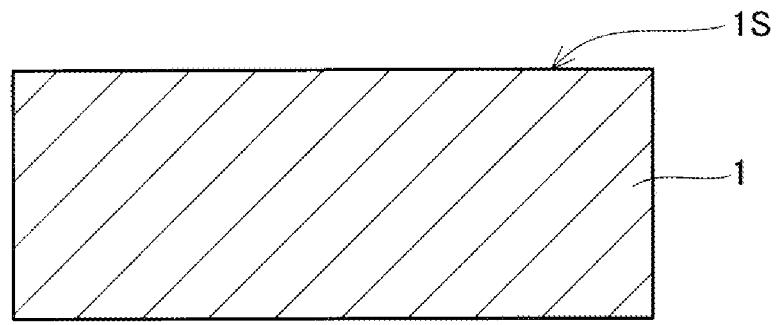
FIG. 1 is a diagram schematically illustrating a cross-sectional view of a main part in a manufacturing process of a semiconductor device according to an embodiment.

As a technique for forming an n-type or p-type diffusion region in a gallium oxide-based semiconductor layer, for example, silicon as an n-type dopant may be ion-implanted into a gallium oxide-based semiconductor layer, and then the gallium-oxide semiconductor layer may be annealed under a nitrogen atmosphere to activate the ion-implanted silicon. As a result, the n-type diffusion region may be formed.

In gallium oxide-based semiconductors, the activation rate of the dopant tends to decrease particularly when the dopant concentration is high. Therefore, in order to form a highly conductive diffusion region, it is necessary to implant the dopant at a high concentration. However, when the dopant is ion-implanted at a high concentration, the gallium oxide-based semiconductor layer is likely to become structurally amorphous. In order to recover the crystals of such an amorphized gallium oxide-based semiconductor layer, the gallium oxide-based semiconductor layer needs to be subjected to an annealing treatment at a high temperature. However, such a high temperature annealing treatment promotes oxygen release from the gallium oxide-based semiconductor layer.

Thus, when the diffusion region is formed in the gallium oxide-based semiconductor layer, there is a concern that crystal damage due to amorphization and oxygen vacancy defects remains. In the above, the drawback that the crystal damage remains in the gallium oxide-based semiconductor layer has been described by taking the case of forming a highly conductive diffusion region as an example. However, even when a low conductive diffusion region is formed, the crystal damage naturally remains in the gallium oxide-based semiconductor layer.

The present disclosure provides a technique for forming a diffusion region in a gallium oxide-based semiconductor layer with less crystal damage in a manufacturing method of a semiconductor device having the gallium oxide-based semiconductor layer.

According to an aspect of the present disclosure, a method for manufacturing a semiconductor device having a gallium oxide-based semiconductor layer includes: ion-implanting dopant into a gallium oxide-based semiconductor layer while heating the gallium oxide-based semiconductor layer; and annealing the gallium oxide-based semiconductor layer under an oxygen atmosphere, after the ion-implanting.

In such a method, since the dopant is ion-implanted into the gallium oxide semiconductor layer while heating the gallium oxide semiconductor layer, it is possible to suppress the gallium oxide semiconductor layer from becoming amorphous during the ion implantation. Further, since the gallium oxide-based semiconductor layer is annealed under an oxygen atmosphere, oxygen leakage from the gallium oxide-based semiconductor layer during the annealing can be suppressed. According to the method described above, a diffusion region can be formed in the gallium oxide-based semiconductor layer in a state of less crystal damage.

Hereinafter, as an embodiment, a method for manufacturing a semiconductor device having a gallium oxide-based semiconductor layer will be described with reference to the drawings. In particular, an ion implantation process and an annealing process of the manufacturing method will be described. In the manufacturing method, processes other than the ion-implantation process and the annealing process may be performed by known manufacturing techniques. A semiconductor device manufactured by using the ion implantation process and the annealing process described below is not particularly limited, but may be, for example, a MOSFET, an IGBT, or a diode.

First, as shown in FIG. 1, a gallium oxide-based semiconductor layer 1 is prepared. In an example, the gallium oxide-based semiconductor layer 1 is a single crystal of $\beta$-$Ga_2O_3$ in which the surface 1S has a plane orientation of (001). The crystal structure of the gallium oxide-based semiconductor layer 1 is not limited to the single crystal of $\beta$-$Ga_2O_3$, but may be another crystal structure, for example, a single crystal of $\alpha$-$Ga_2O_3$. Further, the crystal structure of the gallium oxide-based semiconductor layer 1 may contain another atom, in addition to gallium (Ga) and oxygen (O).

Figure 2:
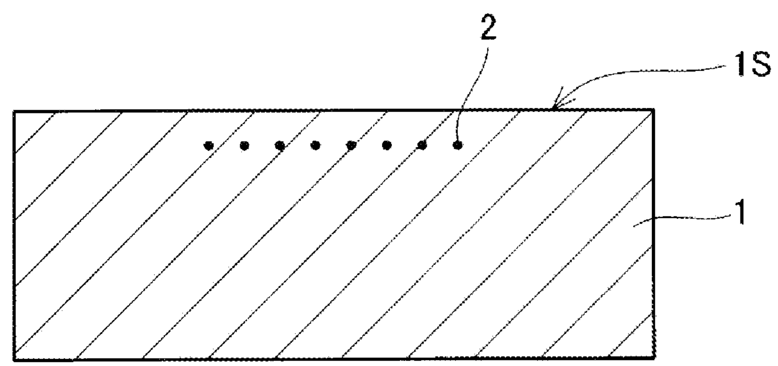
FIG. 2 is a diagram schematically illustrating a cross-sectional view of a main part in a manufacturing process of the semiconductor device according to the embodiment.

Next, as shown in FIG. 2, a dopant 2 is ion-implanted into a part of the surface layer portion of the gallium oxide-based semiconductor layer 1 by using an ion implantation technique. Namely, an ion-implantation process is performed. Although not shown, a mask is formed on the surface 1S of the gallium oxide semiconductor layer 1, and the dopant 2 is ion-implanted to a part of the surface layer portion of the gallium oxide semiconductor layer 1 exposed from an opening of the mask. The dopant 2 may be ion-implanted into the surface layer portion of the gallium oxide-based semiconductor layer 1 through multiple steps.

Figure 4:
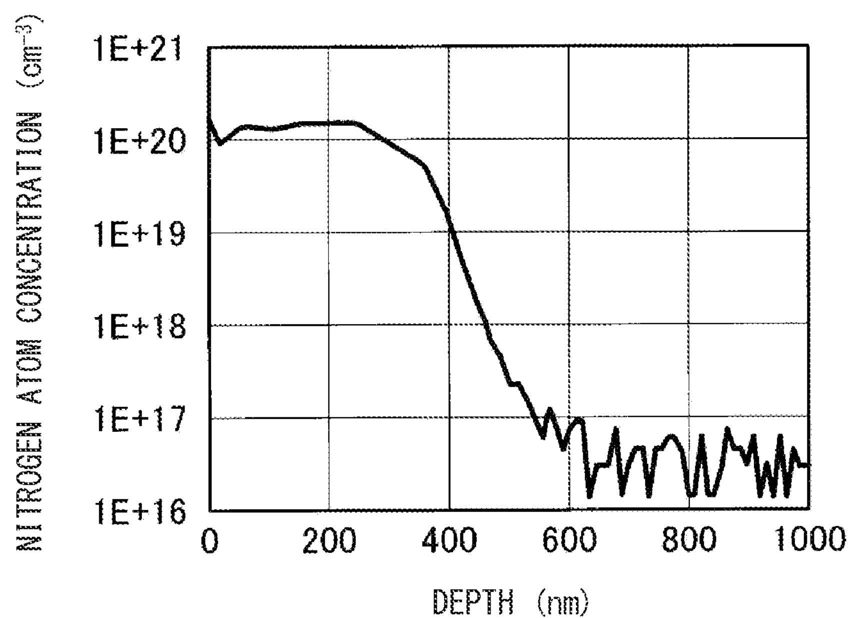
FIG. 4 is a diagram illustrating a concentration profile of an ion-implanted dopant along a depth direction from the surface of the gallium oxide semiconductor layer according to the embodiment.

The type of dopant 2 is not particularly limited. In the example, the dopant 2 is nitrogen (N), which is a p-type dopant. As another example, the dopant 2 may be silicon, which is an n-type dopant. The dopant 2 is ion-implanted in the surface layer portion of the gallium oxide semiconductor layer 1 so that the dopant concentration is $1\times10^{20}$ $cm^{-3}$ or more. FIG. 4 shows a concentration profile of nitrogen ion-implanted in the gallium oxide-based semiconductor layer 1. As shown in FIG. 4, it is confirmed that the nitrogen concentration is $1\times10^{20}$ $cm^{-3}$ or more from the surface to a depth of 300 nm.

The ion-implantation process is performed while heating the gallium oxide-based semiconductor layer 1. In the example, the heating temperature of the gallium oxide-based semiconductor layer 1 is 500 degrees Celsius (° C.). Note that the heating temperature of the gallium oxide-based semiconductor layer 1 may be equal to or higher than 500° C. and equal to or lower than the melting point of the gallium oxide-based semiconductor layer 1. When the heating temperature is 500° C. or higher, it is possible to suppress the gallium oxide semiconductor layer 1 from becoming amorphous due to implantation damage during the ion implantation. Since the amorphization is suppressed, the dopant 2 is efficiently introduced into the lattice position. When the heating temperature is equal to or lower than the melting point, it is possible to suppress the gallium oxide-based semiconductor layer 1 from melting during the ion implantation. Note that the upper limit of the heating temperature can be specifically 1200° C. When the heating temperature is 1200° C. or lower, the crystallinity of the gallium oxide-based semiconductor layer 1 is well maintained at the time of the ion implantation.

Figure 3:
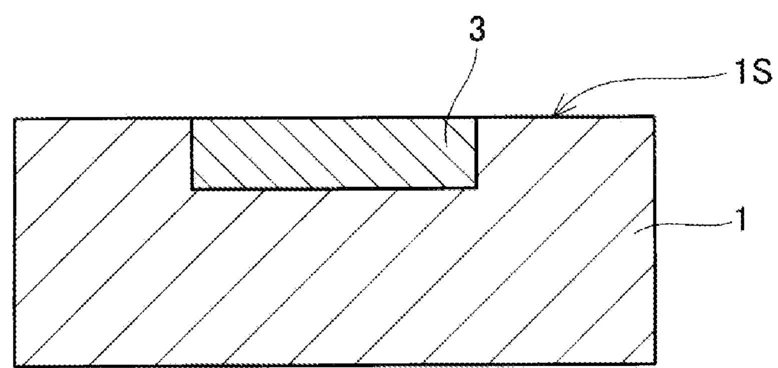
FIG. 3 is a diagram schematically illustrating a cross-sectional view of a main part in a manufacturing process of the semiconductor device according to the embodiment.

Next, as shown in FIG. 3, the gallium oxide-based semiconductor layer 1 is subjected to an annealing treatment to activate the dopant 2, thereby to form the diffusion region 3. Namely, an annealing process is performed. The annealing process is performed under an oxygen atmosphere. The heating temperature of the gallium oxide-based semiconductor layer 1 is not particularly limited, but is 1000° C. in the example. The heating time of the gallium oxide-based semiconductor layer 1 is not particularly limited, but is 30 minutes in the example. Note that the heating temperature and the heating time may be appropriately adjusted to other conditions. For example, the heating temperature may be equal to or higher than 1000° C. and equal to or lower than the melting point of the gallium oxide-based semiconductor layer 1. When the heating temperature is 1000° C. or higher, the crystals in the amorphized region of the surface layer portion of the gallium oxide-based semiconductor layer 1 can be effectively recovered. When the heating temperature is equal to or lower than the melting point, it is possible to suppress the gallium oxide-based semiconductor layer 1 from melting during the annealing process. Note that the upper limit of the heating temperature can be specifically 1200° C. When the heating temperature is 1200° C. or lower, the crystallinity of the gallium oxide-based semiconductor layer 1 is well maintained during the annealing process. The heating time is not particularly limited, and may be appropriately adjusted.

As described above, the annealing process is performed in the oxygen atmosphere. As a result, oxygen leakage from the gallium oxide-based semiconductor layer 1 during the annealing process can be suppressed, so an occurrence of oxygen vacancy defects can be suppressed. Therefore, in the annealing process, it is possible to recover the crystals in the amorphized region due to the ion implantation process while suppressing the occurrence of oxygen vacancy defects. As described above, the combination of the ion implantation process and the annealing treatment process enables formation of the diffusion region 3 in the surface layer portion of the gallium oxide-based semiconductor layer 1 with less crystal damage.

Figure 5:
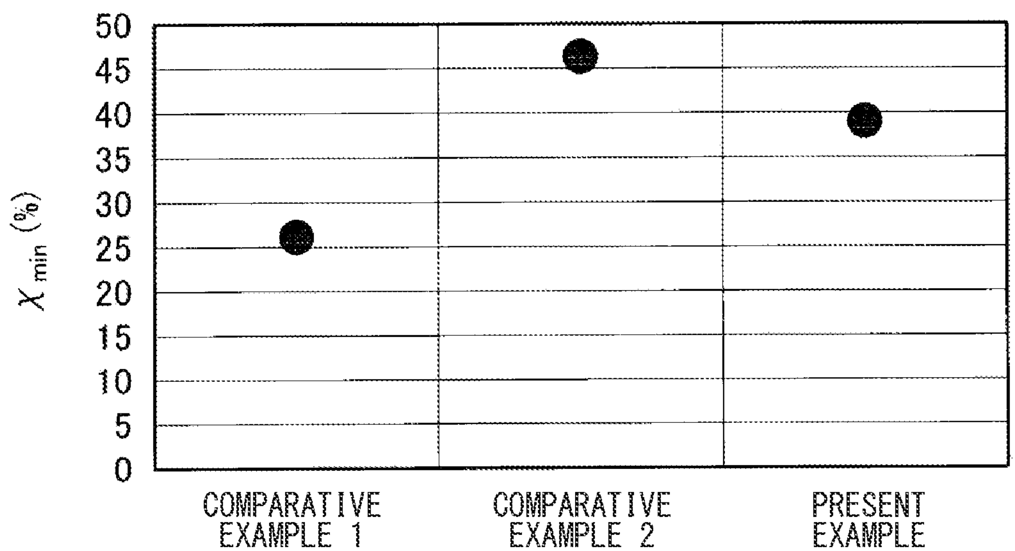
FIG. 5 is a diagram illustrating a comparison of crystal damage between comparative examples and an example of the embodiment.

FIG. 5 shows the results of qualitative evaluation of crystallinity using the Rutherford backscatter analysis method. A vertical axis of the graph of FIG. 5 represents an index $X_{min}$ of the backscattering intensity when the crystal is irradiated with He ions. The higher the value $X_{min}$ is, the worse the crystallinity is. In FIG. 5, a comparative example 1 shows the result of a sample that was not subjected to the ion implantation process and the annealing process. The value $X_{min}$ of the comparative example 1 is a reference value (26.1%). The closer the value $X_{min}$ of the sample is to the reference value, the less the crystal damage due to the ion implantation process and the annealing process is.

A present example shows the result of a sample of the example of the embodiment, in which the ion implantation process was carried out at 500° C., and the annealing process was carried out under an oxygen atmosphere at 1000° C. for 30 minutes. A comparative example 2 shows the result of a sample in which the ion implantation process was carried out at room temperature and the annealing process was carried out under an oxygen atmosphere at 1000° C. for 30 minutes, which is the same condition as in the present example (i.e., 1000° C. for 30 minutes under an oxygen atmosphere).

The value $X_{min}$ of the comparative example 2 is increased by about 20 points as compared with the comparative example 1. It is presumed that the sample, which was amorphized in the ion implantation process, could not be sufficiently crystallized even in the annealing process.

In the present example of the embodiment, the value $X_{min}$ is lower than that of the comparative example 2. It is presumed that the crustal damage remaining in the gallium oxide-based semiconductor layer 1 was suppressed by the combination of the ion implantation process and the annealing process in the present example of the embodiment. Namely, it is presumed that the amorphization during the ion implantation process was suppressed, and the oxygen leakage was compensated in the annealing process to suppress the occurrence of oxygen vacancy defects.

Further, in the present example, the ion implantation is carried out so that the dopant concentration is $1\times10^{20}$ $cm^{-3}$ or more in the surface layer portion of the gallium oxide semiconductor layer 1. When the ion implantation is carried out so as to have such a high dopant concentration, the amorphization is likely to be promoted, resulting the residual crystal damage and the reduction of activation rate. According to the technique of combining the ion implantation process and the annealing process in the above-described embodiment, it is possible to form the diffusion region 3 with less crystal damage even when it is desired to form the diffusion region at such a high dopant concentration. Therefore, the above-mentioned technique according to the embodiment is particularly useful when it is desired to form the diffusion region at a high dopant concentration. However, the above-described technique of the embodiment is useful only on the point of the reduction of the crystal damage, and is also useful in a case where the ion implantation is carried out under a low dose condition in which the dopant concentration is in the range of $1\times10^{16}$ $cm^{-3}$ or more and $1\times10^{19}$ $cm^{-3}$ or less.

Although the specific examples of the present disclosure have been described in detail above, these are merely examples and do not limit the scope of claims. The techniques described in the claims include various modifications and modifications of the specific examples illustrated above. In addition, the technical elements described in the present description or the drawings exhibit technical usefulness alone or in various combinations, and are not limited to the combinations described in the claims at the time of filing. In addition, the techniques illustrated in the present specification or drawings can achieve multiple purposes at the same time, and achieving one of the purposes itself has technical usefulness.

What is claimed is:

1. A method for manufacturing a semiconductor device having a gallium oxide-based semiconductor layer, the method comprising:

ion-implanting dopant into the gallium oxide-based semiconductor layer while heating the gallium oxide-based semiconductor layer; and after the ion-implanting, annealing the gallium oxide-based semiconductor layer under an oxygen atmosphere, wherein a dopant concentration of the dopant ion-implanted in the ion-implanting is $1\times10^{20}$ $cm^{-3}$ or more, in the ion-implanting, the gallium oxide-based semiconductor layer is heated at a temperature equal to or higher than 500 degrees Celsius and equal to or less than 1200 degrees Celsius, and in the annealing, the gallium oxide-based semiconductor layer is heated at a temperature equal to or higher than 1000 degrees Celsius and equal to or less than 1200 degrees Celsius.

2. The method for manufacturing a semiconductor device according to claim 1, wherein the gallium oxide-based semiconductor layer is $\beta$-$Ga_2O_3$.

3. The method according to claim 1, wherein in the ion-implanting, the gallium oxide-based semiconductor layer is heated at 500 degrees Celsius.

4. The method according to claim 1, wherein the dopant is nitrogen or silicon.

5. The method according to claim 1, wherein the dopant concentration is a concentration of the dopant in a surface layer portion of the gallium oxide-based semiconductor layer and is more than $1\times10^{20}$ $cm^{-3}$.

6. The method according to claim 5, wherein the dopant concentration is more than $1\times10^{20}$ $cm^{-3}$ in the surface layer portion from a surface of the gallium oxide-based semiconductor layer to a depth of 300 nm.

* * * * *